United States Patent [19]

Krambeck et al.

[11] Patent Number: 4,479,216
[45] Date of Patent: Oct. 23, 1984

[54] SKEW-FREE CLOCK CIRCUIT FOR INTEGRATED CIRCUIT CHIP

[75] Inventors: Robert H. Krambeck; Masakazu Shoji, both of Warren, N.J.

[73] Assignee: AT&T Bell Laboratories, Murray Hill, N.J.

[21] Appl. No.: 452,157

[22] Filed: Dec. 22, 1982

[51] Int. Cl.³ .............................................. H03K 5/06
[52] U.S. Cl. .................................... 371/61; 307/265; 307/269
[58] Field of Search .................. 371/61; 307/269, 265, 307/597, 603; 328/58

[56] References Cited

U.S. PATENT DOCUMENTS

| | | | |
|---|---|---|---|
| 3,712,994 | 1/1973 | Graziani | 307/603 |
| 4,135,160 | 1/1979 | Gagliani | 328/58 |
| 4,239,992 | 12/1980 | Perkins | 307/265 |
| 4,241,418 | 12/1980 | Stanley | 307/265 X |
| 4,277,697 | 7/1981 | Hall et al. | 307/265 |
| 4,355,283 | 10/1982 | Ott | 307/265 X |

Primary Examiner—Charles E. Atkinson
Attorney, Agent, or Firm—Herbert M. Shapiro

[57] ABSTRACT

An op-amp feedback arrangement is used to provide non-skewed clock pulses from a source of skewed clock pulses. Any skew in the clock-in pulses results in a change in the average voltage of a clock-out pulse at the output of the arrangement. The average voltage of the clock-out pulse is compared to a reference voltage to produce a control signal which adjusts the average voltage at the output. Critical transitions in the clock pulses occur at precise time relationships under the control of the control signal.

8 Claims, 13 Drawing Figures

DUTY CYCLE 60%

DUTY CYCLE 80%

DUTY CYCLE 10%

DUTY CYCLE 40%

SKEW-FREE CLOCK CIRCUIT FOR INTEGRATED CIRCUIT CHIP

FIELD OF THE INVENTION

This invention relates to semiconductor integrated circuit chips and, more particularly, to clock circuits for synchronizing functional elements in such chips.

BACKGROUND OF THE INVENTION

A microprocessor is well known to include a datapath section as well as logic and control sections. Each such section includes functional elements which are clocked in order to achieve synchronous operation as is well known.

One of the most difficult design problems of a microprocessor is to generate skew-free clock signals in order to synchronize the functional elements. In this connection, the term "skew" is defined as irregular variations in the timing of transitions in the clock signal which occur primarily because of the organization of the clock source itself. For example, whenever a clock source includes a buffer, a skew of the order of one nanosecond (1 ns) is inevitably added. Also, when a clock source includes a counter, the output waveform of the source is sensitive to layout parasitics, process variations, temperature and the duty cycle of the input clock. Consequently, skew in excess of 1 ns not only can occur but is difficult to avoid.

BRIEF DESCRIPTION OF THE INVENTION

The present invention is based on the recognition that variations in the timing of transitions in a clock signal are accompanied by variations in the average voltage of the clock signal and that the voltage variations can be made to adjust the timing of the transitions. Specifically, a clock pulse-shaping circuit is achieved in which a skewed clock-in signal at the input generates a change in average voltage at the output. The change in voltage is used to adjust a control voltage in a manner to adjust the timing of the transitions.

In one embodiment, an input clock signal termed hereinafter a "clock-in" signal is supplied to the input of a clock pulse-shaper circuit including a series arrangement of inverters and a variable delay stage. It is assumed, for purposes of description, that the clock-out signal has a 50 percent duty cycle and that the clock-in signal has an undesirable duty cycle in excess of 50 percent leading to an average DC voltage of a clock-out signal of over $V_{DD}/2$. An op-amp, operative at a low speed to ensure that no clock frequency is transmitted, is used to compare the average output voltage to a reference voltage $V_{DD}/2$. The reference voltage is selected to provide a 50 percent duty cycle. As a consequence of the duty cycle being above 50 percent and the role of the low-speed op-amp, the pull-up time at the output is increased and the rising edge of the clock-out signal is delayed. A further consequence is that the clock-out signal approaches a 50 percent duty cycle clock pulse which is maintained if the op-amp has a high gain. Any skew in the occurrence of transitions in a clock-in signal appears as a much smaller skew in output transitions and a small change in the average voltage of the output. An op-amp is a well-known circuit element operative between $V_{DD}$ and ground. If the positive input to an op-amp is slightly higher than the negative input, the output is $+V_{DD}$; if slightly less, the output is ground. In the transition region between $V_{DD}$ and ground, the circuit has very high gain. The present invention employs such known op-amp negative feedback techniques to produce a novel clock pulse-shaping circuit.

DETAILED DESCRIPTION

Figure 1:
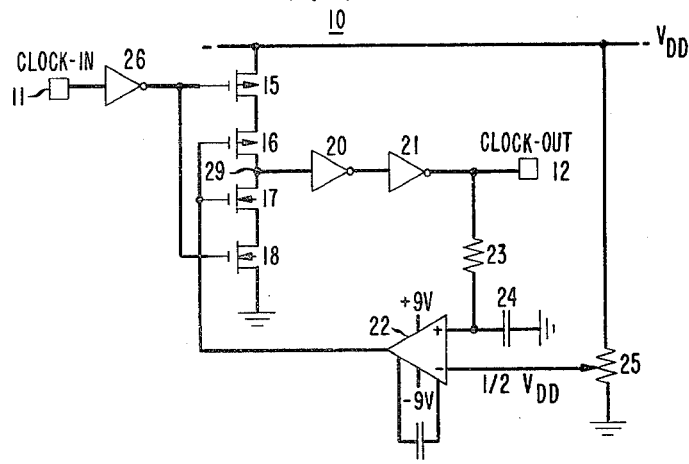
FIG. 1 is a block diagram of a clock pulse-shaping circuit in accordance with this invention.

FIG. 1 shows a clock pulse-shaping circuit 10 including clock-in node 11 and output node 12 and adapted to suppress the effect of any skew in the clock-in signal at node 11.

The circuit comprises a series of p- and n-channel field effect transistors 15 and 16 and 17 and 18, respectively, connected drain-to-source as shown between a source of voltage $V_{DD}$ and ground. The drain electrodes of transistors 16 and 17 are connected to the clock-out node 12 by means of a series connection of two inverters, 20 and 21. The gate electrodes of transistors 16 and 17 are connected to the output of op-amp 22. The positive input to op-amp 22 is connected to node 12 by a resistance 23 of typically 0.1 Megohm and is loaded typically by a 1000 picofarad capacitance 24. The negative input to op-amp 22 is connected to ground through a variable 5000 ohms resistance 25. The gate electrodes of transistors 15 and 18 are connected to the output of inverter 26, the input of which is connected to the clock-in input node 11.

In operation, the average voltage at node 12 is compared by op-amp 22 to a reference voltage for generating a control voltage to alter the timing of transitions in the clock-in signal. Specifically, an input clock pulse at node 11 is inverted by inverter 26 causing p-channel transistor 15 to switch on and n-channel transistor 18 to switch off. Let us assume, for convenience of explanation, that the output voltage of the op-amp is $\frac{1}{2} V_{DD}$. A reference voltage of $\frac{1}{2} V_{DD}$ is maintained on the negative input of op-amp 22. A 50 percent duty cycle output is ensured by adjusting the variable resistor 25.

Figure 2:
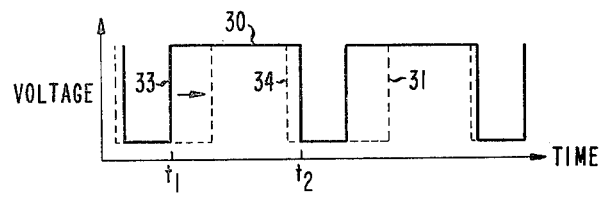
FIG. 2 is a graph of voltage versus time of a clock signal output from the circuit of FIG. 1.

A clock-in signal at node 11, of any duty cycle, is represented by solid curve 30 of FIG. 2. Curve 30 is assumed to have a duty cycle in excess of 50 percent. Consequently, the average DC voltage at node 12 is in excess of $\frac{1}{2} V_{DD}$. Op-amp 22 and the resistor 23 and capacitor 24 are selected to have characteristics such that they do not transmit any clock frequency components but do transmit lower frequency signals. Since the positive input of op-amp 22 is higher than the negative input, the output of the op-amp approaches $V_{DD}$. The result is that the pullup of transistor 15 is delayed and the pulldown of transistor 18 is accelerated by an amount proportional to the difference between the average DC voltage and $\frac{1}{2}$ $V_{DD}$ reference voltage. The clock-out signal is represented by broken curve 31 in FIG. 2. This results in a change in the duty cycle as represented by curve 31 appearing at 12 in FIG. 1. But the transitions at 33 and 34 occur such that times $t_1$ and $t_2$ satisfy $t_2 - t_1 = \frac{1}{2}$ period. To be exact:

$$(t_2 - t_1)_{out} - \frac{1}{2} T = \left[ (t_2 - t_1)_{in} - \frac{1}{2} T \right] \div A$$

where T is the period of the input pulse and A=gain of amplifier regardless of the delay (skew) in the clock-in signal.

An experimental circuit was built using RCA CD 4007 CMOS building blocks and a Western Electric 502T op-amp. FIGS. 3, 4, 5 and 6 are plots of voltage versus time at clock-out node 12 of FIG. 1 and were obtained by operating such a circuit. The Figures show that in a range of duty cycles of the input clock, from 10 percent to 80 percent, the output clock duty cycle is locked in at 50 percent.

Figure 7:
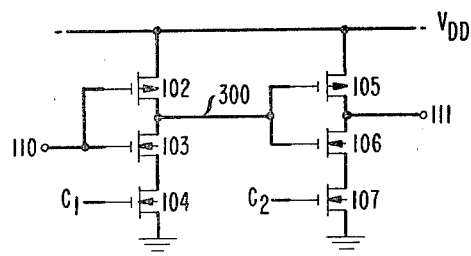
FIGS. 7, 8 and 9 are schematic diagrams of portions of a practical circuit arrangement in accordance with this invention.

FIG. 7 shows a circuit component utilized for generating an accurate pair of two-phase clock signals at a 1X clock frequency from the 50 percent duty cycle 1X clock generated by the scheme of FIG. 1. The clock-out signal is generated in a manner which permits control of the rising and trailing edges of the clock-in signal independently. FIG. 7 shows two sets of p- and n-channel transistors—102, 103 and 104 and 105, 106 and 107—each set being connected electrically in series, source-to-drain as shown, between $V_{DD}$ and ground. Transistors 102 and 105 are p-channel field effect transistors; the remaining are n-channel. The gate electrodes of transistor 102 and 103 are connected to an input node 110 and the drain-to-drain connection between transistors 102 and 103 is connected to the gate electrodes of transistors 105 and 106. The gate electrodes of transistors 104 and 107 are connected to a source of delay control signals C1 and C2, respectively. An output node 111 is connected to the drains of transistors 105 and 106. The circuit operates as a variable delay represented by block 120 in FIG. 8. Such a circuit is useful independently but is shown illustratively for use in generating non-skewed clock pulses as a part of a circuit described in connection with FIG. 9.

Figure 8:
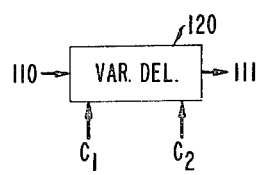
Figure 5:
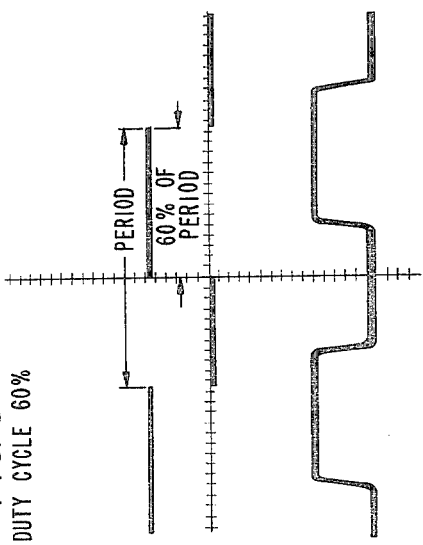
FIGS. 3, 4, 5 and 6 are graphs of voltage versus time of actual clock signal outputs for different input clock signals of experimental duty cycles. The output clock duty cycle is locked in at 50 percent as can be seen from the Figures.
Figure 6:
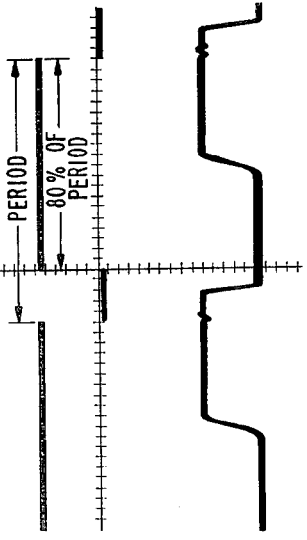
Figure 3:
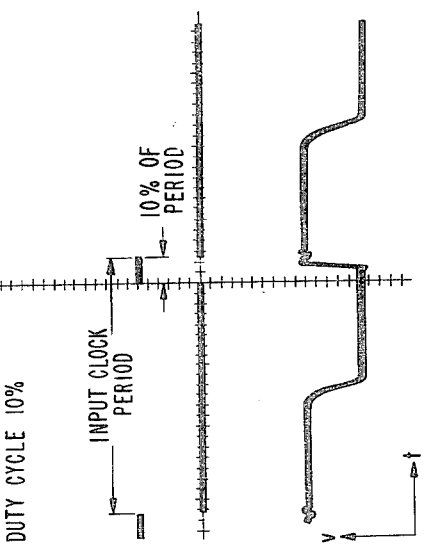
Figure 4:
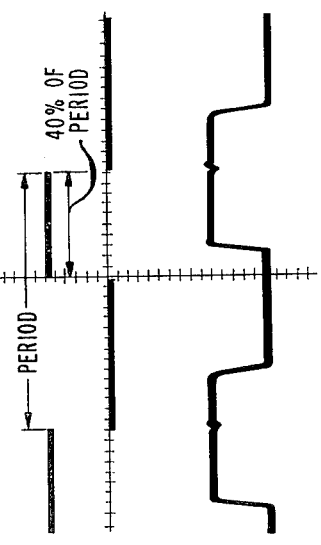
Figure 9:
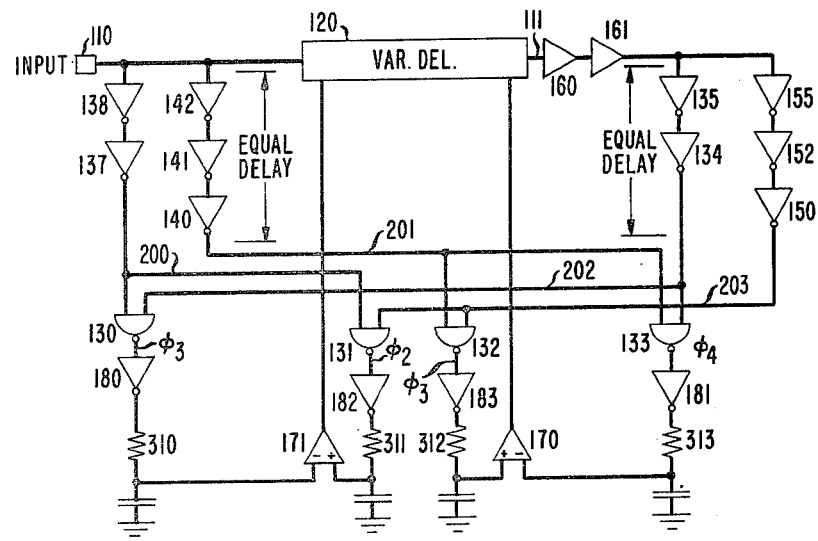

The circuit of FIG. 9 includes four NAND circuits 130, 131, 132 and 133. An input of each of NAND circuits 130 and 133 is connected to the output 111 by means of a series connection of inverters 134 and 135. Similarly, an input of each of NAND circuits 130 and 131 is connected to input node 110 via a series connection of inverters 137 and 138. An input to each of NAND circuits 132 and 133 is connected to node 110 via a series arrangement of three inverters 140, 141 and 142. NAND circuits 131 and 132 are connected to output node 111 via a series arrangement of inverters 150, 152 and 155. The circuit 120 of the type represented in FIG. 8 is connected between input node 110 and output node 111. A clock-out signal at output node 111 of circuit 120 is applied to the input to inverter 135 via a series arrangement of two inverters 160 and 161. The outputs of first and second op-amps 170 and 171 are connected to the C1 and C2 inputs to circuit 120. The outputs of NAND circuits 130 and 133 are connected to the negative inputs to op-amps 171 and 170, respectively, via associated inverters 180 and 181. Similarly, the outputs of NAND circuits 131 and 132 are connected to the positive inputs to op-amps 171 and 170, respectively, via associated inverters 182 and 183. The output of the associated inverters, in each instance, is connected via associated resistance and capacitances to ground.

Figure 10:
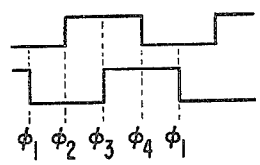
FIG. 10 is a pulse diagram of the output of the circuit arrangement of FIG. 9.

The circuit of FIG. 9 is operative to generate a familiar four-phase clock-out signal as shown in FIG. 10 as follows: A series arrangement of two inverters, such as 137 and 138 and 134 and 135 or 160 and 161, does nothing but delay an input pulse form. A series arrangement of three inverters, such as 140, 141 and 142 or 150, 152 and 155, is designed to provide a pulse of delay equal to the associated arrangement of two inverters. But the pulse in the latter instance has an opposite polarity. A clock-in pulse at 110 provides a delayed pulse on conductor 200 and an equally delayed pulse of opposite polarity on conductor 201. The result is a positive pulse applied to inputs to NAND circuits 130 and 131 and negative pulse applied to inputs to NAND circuits 132 and 133 at the phases indicated. Similarly, clock-out signal waveform at output node 111 results in equally delayed positive and negative pulses applied to conductors 202 and 203 and thus inputs to NAND circuits 130 and 133 and to NAND circuits 131 and 132, respectively. The output signals from the NAND circuits are applied to inputs to the associated inverters and the requisite reference DC voltage levels are obtained via the associated resistance-capacitance arrangement to be applied to positive inputs of the associated op-amps. The output signals from op-amps 170 and 171 are applied as control signals C1 and C2, respectively, to the gate electrodes of transistors 104 and 107 of FIG. 7.

Control signals C1 and C2 are voltage signals of values determined by the difference in the average (DC) voltage of the signal at the outputs of inverters 182 and 180 and inverters 183 and 181, respectively. Consider op-amp 170 which generates the C1 control signal. The input signals to op-amp 170 are from NAND circuits 132 and 133. The input signals to NAND circuit 132 are provided, one from the output of inverter 140 (from 110) and one from the output of inverter 150 (from 111). The input signals to NAND circuit 133 are from inverter 134 (from 111) and from inverter 140 (from 110).

A clock-in signal at 110 in FIG. 9 is operative to turn p-channel transistor 102 OFF and n-channel transistor 103 ON (see FIG. 7). The delay time of the voltage signal on conductor 300 of FIG. 7 depends on the voltage level of control signal C1 which determines how fast transistor 104 turns on. The result is that the trailing edge of the voltage pulse on conductor 300 (and thus at node 111 of FIG. 9) is delayed an amount proportional to the voltage level of control signal C1. Similarly, the leading edge of a clock-out signal at output node 111 of FIG. 9 is determined by the voltage level of control signal C2 applied to (n-channel) transistor 107 (see FIG. 7). It should be clear at this juncture in the description that regardless of the amount of skew in the clock-in signal at 110 of FIG. 9, a non-skewed clock-out signal is generated at 111.

It should be clear to one skilled in the art that NAND circuits 130, 131, 132 and 133 may be replaced by NOR circuits and inverters 140 and 250 may be omitted.

Figure 11:
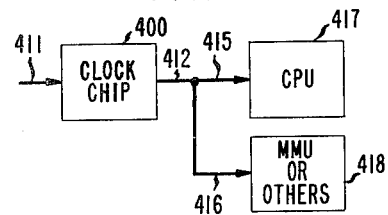
FIGS. 11, 12 and 13 are block diagrams of system organizations using the circuit arrangements of FIGS. 1 and 9.
Figure 12:
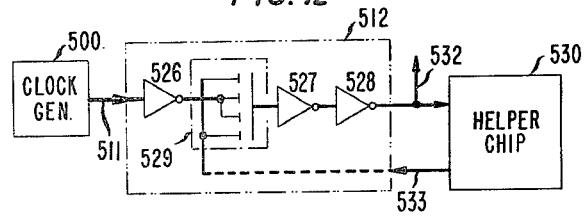
Figure 13:
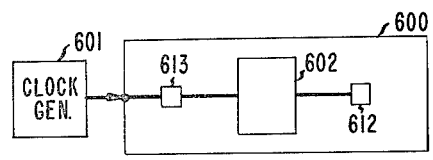

FIGS. 11, 12 and 13 illustrate various circuit organizations of the clock pulse-shaping circuits of FIGS. 1, 7 and 9. The organizations are illustrated in terms of the circuit of FIG. 1. FIG. 11 specifically illustrates a clock chip 400 with clock-in input 411 and clock-out output 412 corresponding to input 11 and output 12 of the circuit of FIG. 1. The non-skewed output is applied to functional elements of say a microprocessor chip via symbolic conductors 415 and 416. The functional elements are represented as blocks 417 and 418.

FIG. 12 illustrates an organization where a source of skewed clock pulses, represented as a block 500, applies pulses to a clock-in input 511 to say a CPU block 512. The CPU chip includes the multistage delay arrangement of three inverters 526, 527 and 528 with a variable delay stage 529. These elements correspond to elements 26, 20, and 21 and the variable delay stage of FIG. 1, respectively. The op-amp is included in a separate "helper" chip 530. Chip 530 also includes a voltage averaging resistor and capacitor (not shown) corresponding to elements 23 and 24 of FIG. 1. The clock-out output is identified at 532 and applied to inputs to chip 512 as well as to other chips. The control signal to the variable delay stage is applied to conductor 533.

FIG. 13 shows an organization where the entire clock pulse-shaping (circuit of FIG. 1 or FIG. 9) is included in a CPU chip 600. In such embodiments, an off-chip clock generator 601 applies pulses to a clock-shaping circuit represented by block 602 included within chip 600, non-skew pulses being generated at clock-out output 612. The clock-in input is represented by block 613.

It is important that the op-amp has a high gain characteristic. That is to say, an op-amp is chosen so that a transition from one voltage output level to another at the output of the op-amp occurs over a narrow input voltage range $V_+ - V_-$ in order to get an increasingly accurate feedback response.

It is also important that the output voltage levels from the op-amp vary over ranges more than $V_{DD}$ minus the threshold voltage of the p-channel transistors and the threshold voltage of the n-channel transitors. In this manner, the variable delay stage has effective control over the signals.

Based on the understanding that skew produces change only in the average voltage of the clock-out signal at the output of inverter 161 in FIG. 9, it should be apparent that transitions in the clock-out signal at 161 can be set to occur at prescribed times by employing standard techniques such as a voltage divider circuit. Further, the invention has been described in terms of a reference voltage to provide a 50 percent duty cycle to achieve equally spaced clock edges (transitions). The reference voltage may be adjusted or set to provide a duty cycle different than 50 percent to permit the clock-out transitions to be located anywhere desired. It should be clear to one skilled in the art that a change in duty cycle can be made to produce a speed-up in chip performance.

What is claimed is:

1. A circuit having an input and an output for generating at said output a clock-out signal having transitions which occur at first time separations and having high and low voltage values, means responsive to said clock-out signal for providing the average voltage of said clock-out signal, said clock-out signal occurring in response to a clock-in signal applied to said input having transitions which occur at second time separations, said circuit comprising delay means connected between said input and said output, said delay means including a variable delay stage having a control input for receiving a control signal for varying the delay in said stage in a manner to change said average voltage, said means for providing said average voltage being adapted to apply said average voltage to a control means, said control means being responsive to changes in said average voltage for applying said control signal to said variable delay stage.

2. A circuit in accordance with claim 1 further comprising means for generating a reference voltage, and a clock pulse-shaping circuit for generating at said output a non-skewed clock-out signal in response to a skewed clock-in signal applied to said input.

3. A circuit in accordance with claim 2 wherein said control means includes an op-amp for comparing said average voltage to said reference voltage for providing said control signal.

4. A circuit in accordance with claim 3 wherein said delay means comprises means for adjusting the timing of the leading and trailing edges of said non-skewed clock-out signal independently.

5. A circuit in accordance with claim 3 also including means for providing said reference voltage, said reference voltage being selected to provide a 50 percent duty cycle.

6. A circuit in accordance with claim 3 also including means for providing said reference voltage, said reference voltage being selected to provide a duty cycle different from 50 percent.

7. A circuit in accordance with claim 3 wherein said op-amp is characterized by high gain.

8. A clock pulse-shaping circuit including a clock-in input and a clock-out output for generating at said output non-skewed clock pulses in response to skewed clock pulses applied to said input, said circuit including a variable delay means connected between said input and said output, said variable delay means having a control input and being operative to provide at said output clock pulses having delays which are determined as a function of a control signal applied to said control input, and control means having first and second control inputs for providing said control signal of a value determined by the difference between first and second average voltages applied to said first and second inputs, respectively, said circuit also comprising means for generating said first average voltage connected to said first control input, and means for generating said second average voltage connected between said clock-out output and said second control input, said circuit being operative to adjust the delay of said clock pulses applied to said clock-in input as a function of the difference between said first and second average voltages.

* * * * *